United States Patent
Ha et al.

(10) Patent No.: US 12,289,007 B2
(45) Date of Patent: Apr. 29, 2025

(54) ELECTRONIC DEVICE AND METHOD FOR MANAGING PLURAL BATTERIES

(71) Applicant: Samsung Electronics Co., Ltd., Gyeonggi-do (KR)

(72) Inventors: Youngmi Ha, Gyeonggi-do (KR); Sungjoon Cho, Gyeonggi-do (KR); Duhyun Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 578 days.

(21) Appl. No.: 17/679,327

(22) Filed: Feb. 24, 2022

(65) Prior Publication Data

US 2022/0337073 A1    Oct. 20, 2022

Related U.S. Application Data

(63) Continuation of application No. PCT/KR2022/002294, filed on Feb. 16, 2022.

(30) Foreign Application Priority Data

Apr. 15, 2021    (KR) .................. 10-2021-0049107

(51) Int. Cl.
*H02J 7/00*    (2006.01)

(52) U.S. Cl.
CPC .......... *H02J 7/0047* (2013.01); *H02J 7/0013* (2013.01)

(58) Field of Classification Search
CPC ............................ H02J 7/0047; H02J 7/0013
USPC ....................................................... 320/136
See application file for complete search history.

(56) References Cited

U.S. PATENT DOCUMENTS

| 5,699,050 | A | * | 12/1997 | Kanazawa | ......... | G01R 31/3648 |
|           |   |   |         |          |          | 320/152 |
| 9,977,091 | B2 |   | 5/2018 | Hawawini et al. | | |
| 11,133,535 | B2 |   | 9/2021 | Kim et al. | | |
| 12,176,497 | B2 | * | 12/2024 | Ghantous | .............. | H02J 7/0047 |
| 2012/0153960 | A1 |   | 6/2012 | Wortham et al. | | |

(Continued)

FOREIGN PATENT DOCUMENTS

CN    112467768 A    3/2021
KR    10-2019-0001830 A    1/2019

(Continued)

OTHER PUBLICATIONS

Extended European Search Report dated Jun. 20, 2024.
International Search Report dated May 23, 2022.
Wrriten Opinion dated May 23, 2022.

*Primary Examiner* — Jack Chiang
*Assistant Examiner* — Suchin Parihar
(74) *Attorney, Agent, or Firm* — Cha & Reiter, LLC

(57) ABSTRACT

An electronic device and method are disclosed, including a first and second battery, a first and second fuel gauge, and a processor. The processor implements the method, including: determining capacity ratios of the first and second batteries based at least on absolute capacities of the first and second batteries, as identified via the first and second fuel gauges, respectively, calculating a residual capacity of the first battery and a residual capacity of the second battery based on at least one of the determined capacity ratios and the obtained states of the first and second battery, respectively, and outputting the calculated residual capacity of the first battery and the calculated residual capacity of the second battery.

20 Claims, 11 Drawing Sheets

(56) References Cited

U.S. PATENT DOCUMENTS

| | | | |
|---|---|---|---|
| 2012/0256587 A1* | 10/2012 | Soong | H02J 7/005 324/426 |
| 2014/0269811 A1* | 9/2014 | Maleki | G01K 15/005 374/1 |
| 2015/0338466 A1 | 11/2015 | Wu | |
| 2017/0170668 A1* | 6/2017 | Hayashizaki | H01M 10/4207 |
| 2019/0039474 A1 | 2/2019 | Wada et al. | |
| 2020/0136422 A1 | 4/2020 | Lee et al. | |
| 2020/0266499 A1 | 8/2020 | Ha et al. | |
| 2020/0284841 A1 | 9/2020 | Moon et al. | |
| 2020/0313446 A1 | 10/2020 | Park et al. | |
| 2020/0395775 A1* | 12/2020 | Hayayama | B60L 58/22 |
| 2021/0168964 A1* | 6/2021 | Nakaya | H01M 10/48 |
| 2022/0140618 A1 | 5/2022 | Yoon et al. | |
| 2022/0247190 A1 | 8/2022 | Kang | |
| 2022/0291287 A1 | 9/2022 | Yoon et al. | |
| 2023/0126838 A1* | 4/2023 | Sharma | H02J 7/0048 307/82 |
| 2023/0187957 A1* | 6/2023 | De Jesus Cardoso Filho | H02M 1/007 320/136 |
| 2023/0208170 A1* | 6/2023 | Kim | H01M 10/482 320/107 |
| 2023/0327466 A1* | 10/2023 | Ho | G01R 31/389 320/134 |
| 2023/0402666 A1* | 12/2023 | Okuyama | H02J 7/0013 |

FOREIGN PATENT DOCUMENTS

| | | |
|---|---|---|
| KR | 10-2020-0048975 A | 5/2020 |
| KR | 10-2020-0101173 A | 8/2020 |
| KR | 10-2020-0107614 A | 9/2020 |
| KR | 10-2021-0014003 A | 2/2021 |
| WO | 2017/086168 A1 | 5/2017 |
| WO | 2020/189998 A1 | 9/2020 |

* cited by examiner

[210]

ELECTRONIC DEVICE AND METHOD FOR MANAGING PLURAL BATTERIES

CROSS REFERENCE TO RELATED APPLICATION(S)

This application is a Continuation of and claims priority under 35 U.S.C. § 120 to PCT International Application No. PCT/KR2022/002294, which was filed on Feb. 16, 2022, and claims priority to Korean Patent Application No. 10-2021-0049107, filed on Apr. 15, 2021, in the Korean Intellectual Property Office, the disclosures of which are incorporated by reference herein their entirety.

BACKGROUND

Technical Field

The disclosure relates to the operation of electronic devices using batteries, and, more particularly, to managing a plurality of batteries in an electronic device.

Description of Related Art

With the development of digital, computer technology, there has been a proliferation of electronic devices, including mobile communication terminals, personal digital assistants (PDA), electronic organizers, smart phones, tablets, personal computers (PC), wearable smart devices, and such. These electronic devices often come in compact sizes, which enhances portability but restricts a potential size of a display. Accordingly, there has been development of portable devices that nevertheless are able to provide enlarged screen areas, using multi-display solutions.

For example, a larger screen may be implemented using a plurality of displays and/or flexible displays. For example, dual-display devices, or foldable, rollable and slidable devices may present configurations enabling larger display areas. A foldable display may be unfolded to expand a screen area. Likewise, a rollable and slidable device may be rolled/slid "outwards" in order to expand a screen area, and retract the same to reduce the screen area and enhance portability.

Other examples of portable electronic devices include glasses-type wearable displays, such as augmented reality (AR) glasses, smart glasses, or head-mounted devices and displays (HMD). These devices can implement extended reality (XR) technology, such as virtual reality (VR), augmented reality (AR), and/or mixed reality (MR). For example, such devices can superimpose digital projections and virtual images on a real-world field of view, either seen naturally through a lens, or captured by a camera and reprojected to the user.

SUMMARY

When an electronic device is equipped with a multi-display, it may be equipped with multiple batteries to help support the enlarged display and/or increased functionality thereof. The batteries are also sensitive to temperature. When batteries are disposed at intervals, the operation of each battery may differ due to experience different temperatures. When these operational differences occur, battery information, such as residual capacity, state-of-charging, etc. may not be accurately calculated.

According to certain embodiments, an electronic device is provided that includes two or more batteries, and includes a fuel gauge capable of accounting for each battery, and a method and apparatus for monitoring a state of each battery using respective fuel gauges, calculating a capacity of each battery, a capacity of an entire set of multiple batteries based on the monitoring of each battery, and calculating deterioration of each individual battery, and of the entire set of multiple batteries.

In accordance with an aspect of the disclosure, an electronic device is disclosed, including: a first battery and a second battery, a first fuel gauge for the first battery, a second fuel gauge for the second battery, a memory, and a processor operatively connected to the first battery, the second battery, the first fuel gauge, the second fuel gauge, and the memory, wherein the processor is configured to: obtain a state of the first battery via the first fuel gauge, obtain a state of the second battery via the second fuel gauge, determine capacity ratios of the first and second batteries based at least on absolute capacities of the first and second batteries, as identified via the first and second fuel gauges, respectively, calculate a residual capacity of the first battery and a residual capacity of the second battery based on at least one of the determined capacity ratios and the obtained states of the first and second battery, respectively, output the calculated residual capacity of the first battery and the calculated residual capacity of the second battery.

In accordance with an aspect of the disclosure, an operation method of an electronic device is disclosed, including: obtaining state information of the first battery via a first fuel gauge, obtaining state information of the second battery from a second fuel gauge, determining capacity ratios of the first and second batteries based at least on absolute capacities of the first and second batteries, as identified via the first and second fuel gauges, respectively, calculate a residual capacity of the first battery and a residual capacity of the second battery based on at least one of the determined capacity ratios and the obtained states of the first and second battery, respectively, and outputting the calculated residual capacity of the first battery and the calculated residual capacity of the second battery.

According to certain embodiments, a fuel gauge and a thermistor are provided for each battery. The thermistor measures the temperature of each battery, and the fuel gauge monitors the capacity and the deteriorated state of each battery. Thus, a remaining battery life for the overall set of batteries can be more accurately predicted.

According to certain embodiments, by including a fuel gauge or thermistor in a battery, the temperature of the battery can be more accurately measured.

According to certain embodiments, by predicting an expected battery life based on the deteriorated state or accumulated usage cycle of a battery, a user can be more accurately notified when a battery is in need of replacement.

DETAILED DESCRIPTION

Figure 1:
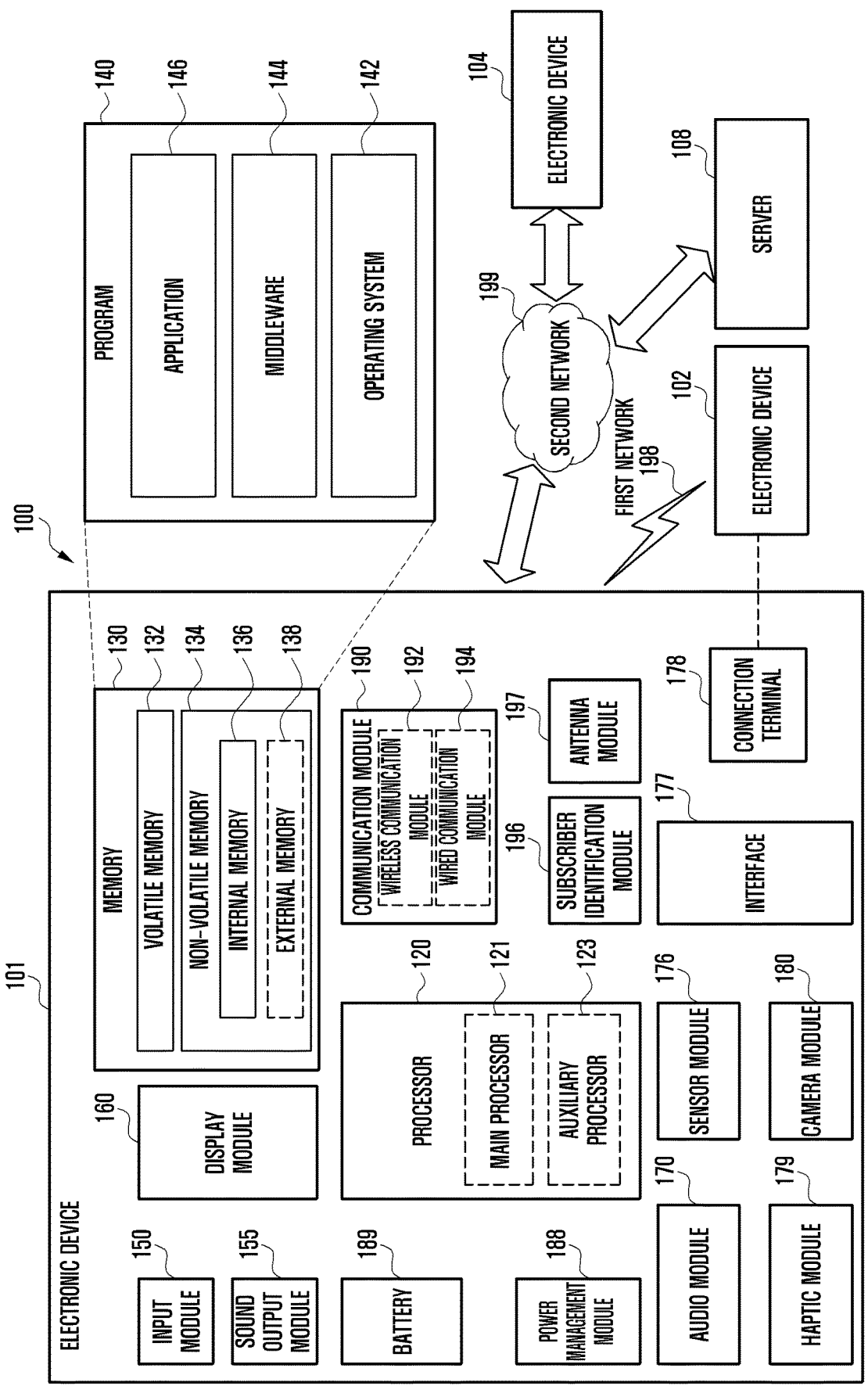
FIG. 1 is a block diagram illustrating an electronic device in a network environment according to certain embodiments.

FIG. 1 is a block diagram illustrating an electronic device 101 in a network environment 100 according to certain embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5th generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4th generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element implemented using a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to certain embodiments, the antenna module 197 may form a mmWave antenna module. According to an embodiment, the mmWave antenna module may include a printed circuit board, an RFIC disposed on a first surface (e.g., the bottom surface) of the PCB, or adjacent to the first surface and capable of supporting a designated high-frequency band (e.g., the mmWave band), and a plurality of antennas (e.g., array antennas) disposed on a second surface (e.g., the top or a side surface) of the PCB, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra-low-latency services using, e.g., distributed computing or mobile edge computing. In another embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to certain embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities, and some of the multiple entities may be separately disposed in different components. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

Figure 2A:
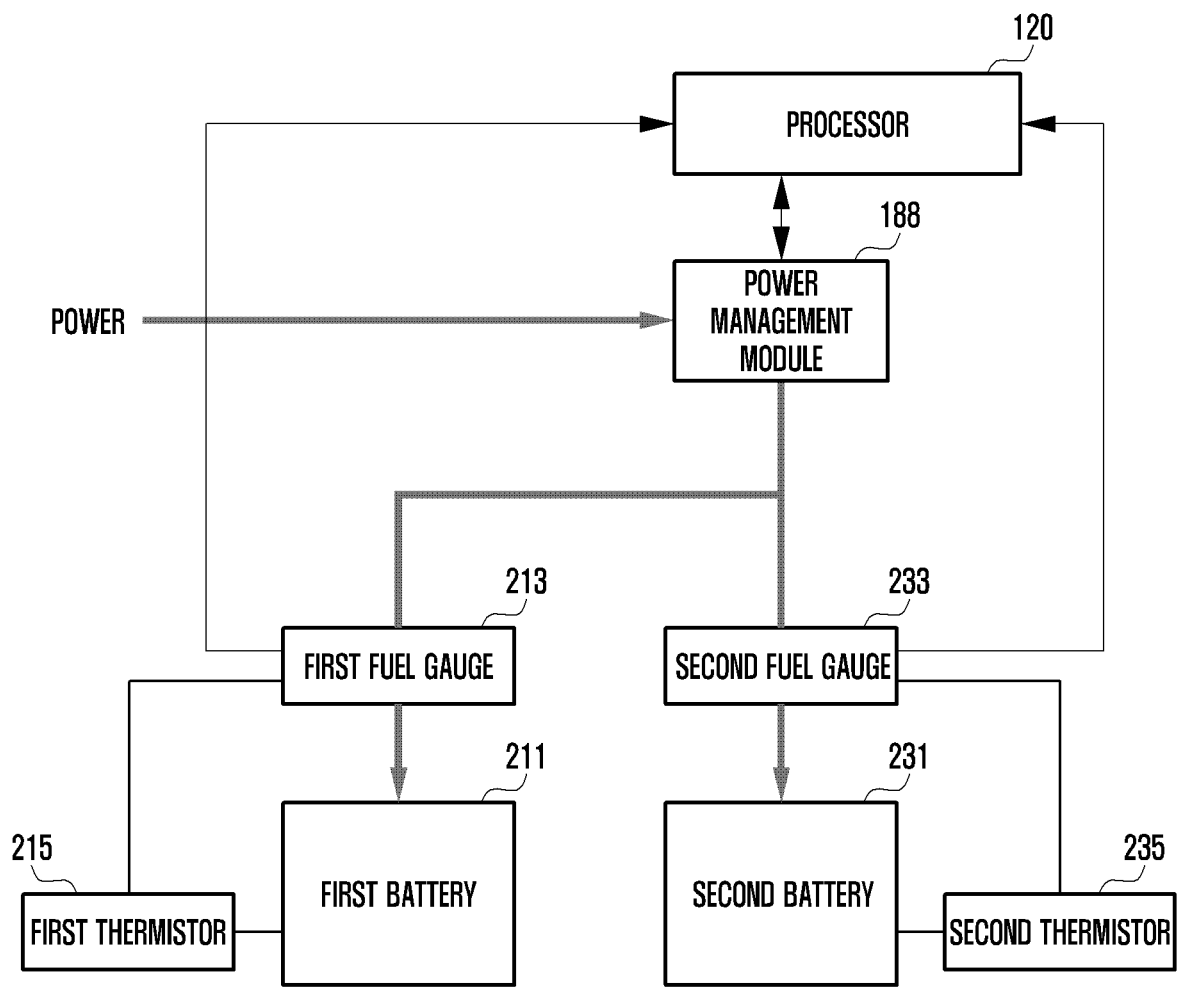
FIGS. 2A, 2B and 2C are diagrams illustrating the configuration of a battery, a fuel gauge, and a thermistor in an electronic device according to certain embodiments.
Figure 2B:
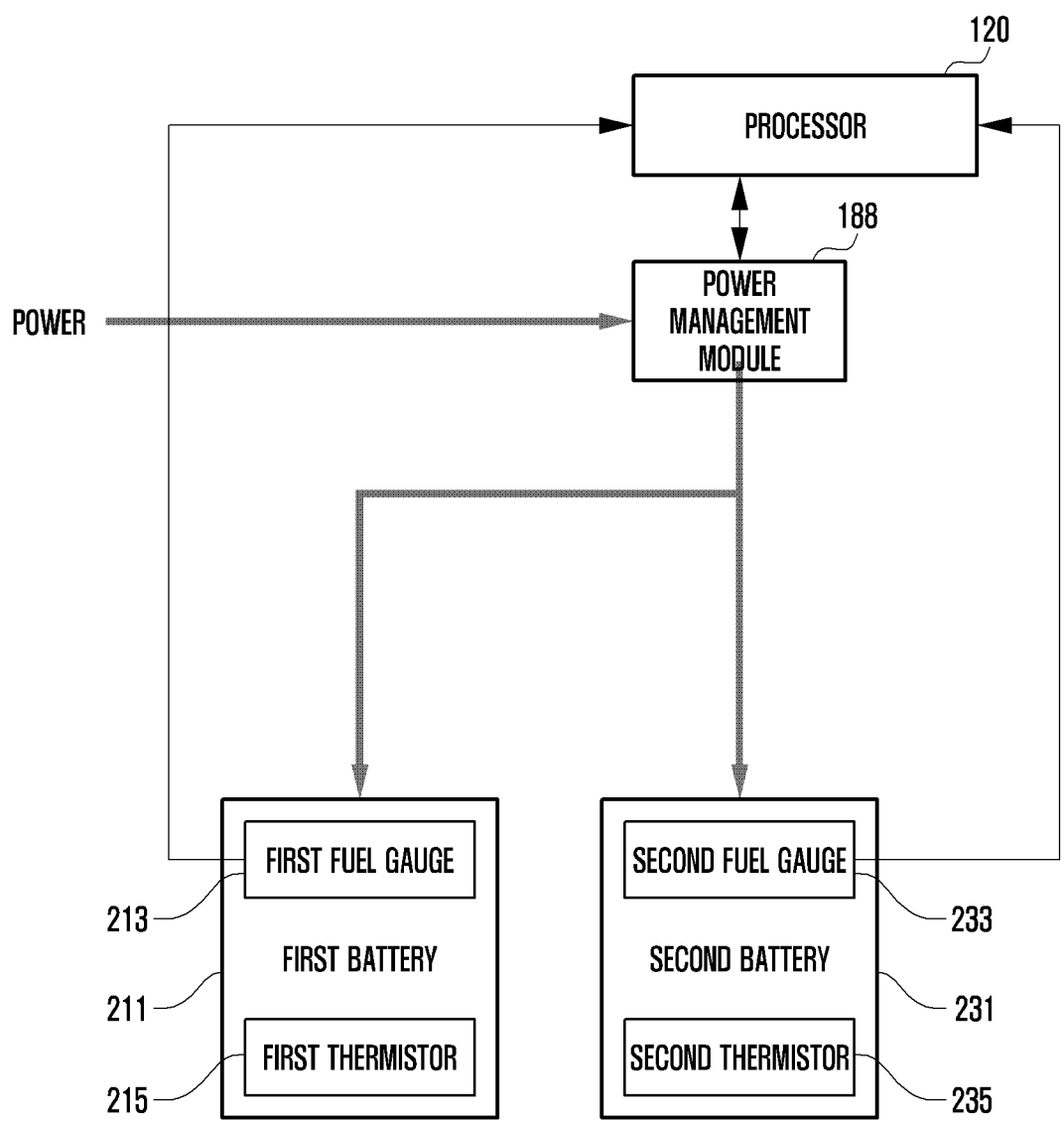
Figure 2C:
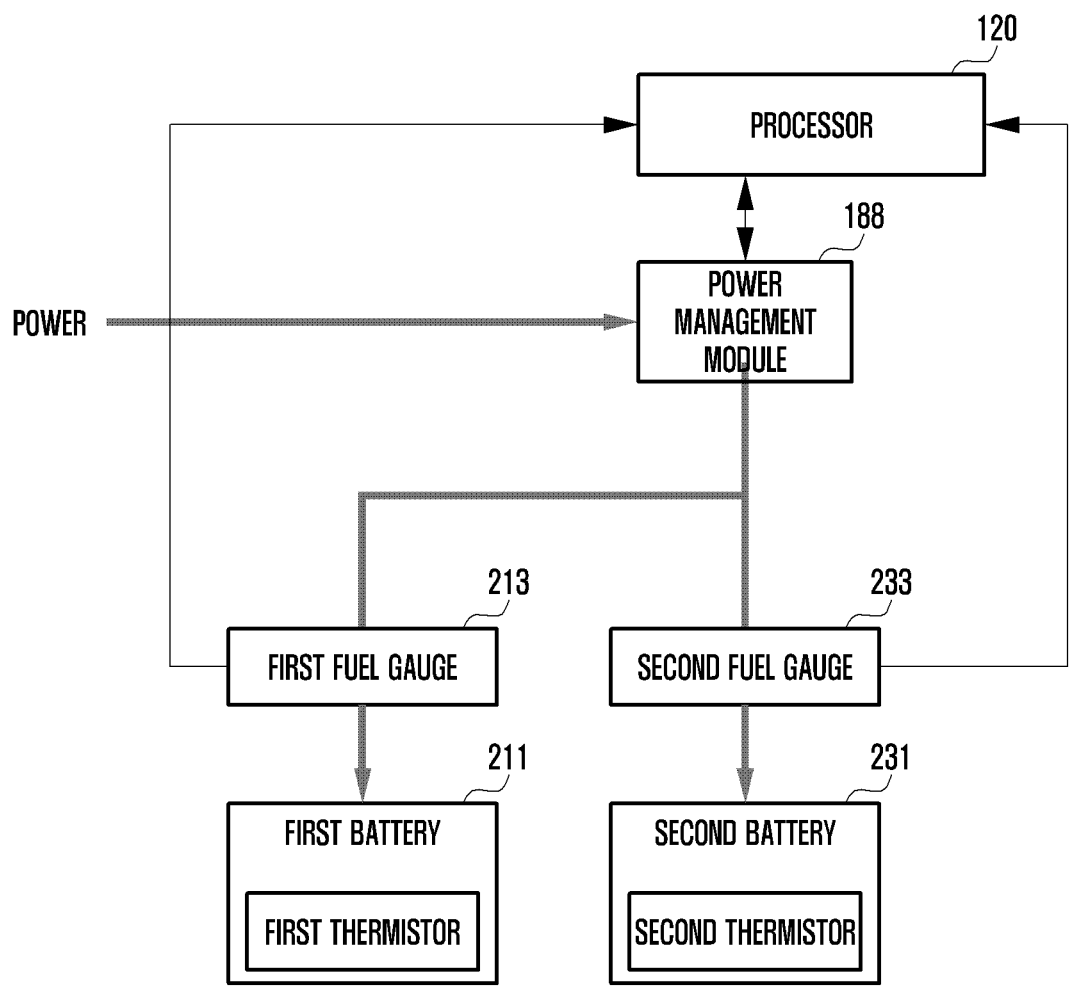

FIGS. 2A to 2C are diagrams illustrating the configuration of a battery, a fuel gauge, and a thermistor in an electronic device according to certain embodiments.

FIG. 2A is a diagram illustrating an example in which an electronic device according to certain embodiments has a first configuration 210.

Referring to FIG. 2A, an electronic device (e.g., the electronic device 101 of FIG. 1) according to certain embodiments may include the first configuration 210, in which a first fuel gauge 213 or a first thermistor 215 is disposed external to a first battery 211 (e.g., the battery 189 of FIG. 1), and a second fuel gauge 233 or a second thermistor 235 is disposed external a second battery 231 (e.g., the battery 189 of FIG. 1). A processor (e.g., the processor 120 of FIG. 1) may be communicably coupled via an electrical path with a power management module (e.g., the power management module 188 of FIG. 1), the first fuel gauge 213, or the second fuel gauge 233. The power management module 188 may be communicably coupled via an electrical path with the first fuel gauge 213, the second fuel gauge 233, the first battery 211, or the second battery 231. The power management module 188 may receive power from an external power source, and may charge the first battery 211 or the second battery 231.

The first thermistor 215 may measure (or monitor) the temperature of the first battery 211, and may transfer the detected temperature of the first battery 211 to the first fuel gauge 213 or the processor 120, either periodically or in real time. The first fuel gauge 213 may obtain the state information of the first battery 211 and transfer the same to the processor 120. The state information of the first battery 211 may include at least one piece of information among a temperature, a charging current, a discharging current, a faulty state, a coupled state, a residual capacity, a state of charging (SoC), a usage cycle, an open circuit voltage (OCV), or an indication of a deteriorated state (or a deteriorated value) for the first battery 211.

The second thermistor 235 may measure (or monitor) the temperature of the second battery 231, and may transfer the detected temperature of the second battery 231 to the second fuel gauge 233 or the processor 120, either periodically or in real time. The second fuel gauge 233 may obtain the state information of the second battery 231 and may transfer the same to the processor 120. The state information of the second battery 231 may include at least one piece of information among a temperature, a charging current, a discharging current, a faulty state, a coupled state, a residual capacity, an SoC, an accumulated usage cycle, an OCV, or an indication of a deteriorated state (or a deteriorated value) for the second battery 231.

The operations and status of a battery may be affected by temperature. If the first battery 211 and the second battery 231 are disposed in different locations within the device, the temperatures of the first battery 211 and the second battery 231 may be different. The chemical characteristic of a battery may vary depending on the temperature inside or outside the electronic device 101 and thus, temperature should be accounted for when calculating capacity and other related characteristics of a battery. The residual capacity of the first battery 211 may be affected by the temperature of the first battery 211 and thus, the first thermistor 215 may be disposed to correspond to the first battery 211 in order to more accurately measure the temperature of the first battery 211. The first fuel gauge 213 may calculate the residual capacity of the first battery 211 based at least on the temperature of the first battery 211 obtained from the first thermistor 215. The second thermistor 235 may likewise be disposed to correspond to the second battery 231. The second fuel gauge 233 may calculate the residual capacity of the second battery 231 based on the temperature of the second battery 231 obtained from the second thermistor 235.

The processor 120 may read values from the first thermistor 215 and/or the second thermistor 235 periodically. The processor 120 may store the state information of the first battery 211 obtained from the first fuel gauge 213 in a memory (e.g., the memory 130 of FIG. 1), or calculate the residual capacity of the first battery 211 based on the state information of the first battery 211. The processor 120 may store the state information of the second battery 231 obtained from the second fuel gauge 233 in the memory 130, or calculate the residual capacity of the second battery 231 based on the state information of the second battery 231.

According to certain embodiments, the first battery 211 and the second battery 231 may be disposed at intervals. For example, for an electronic device having a flexible display (e.g., the display module 160 of FIG. 1), such as a foldable electronic device disposed in a folded state, the first battery 211 and the second battery 231 may be disposed on two opposing sides of the device relative to a central folding axis. The capacities of the first battery 211 and the second battery 231 may be the same, or different from each other. If the capacities of the first battery 211 and the second battery 231 are different from each other, the difference in capacity may be expressed as a capacity ratio of the first battery 211 to the capacity of the entire battery, or the capacity radio of the second battery 231 to the capacity of the entire battery, the ratio of which may be stored in the memory 130. Alternatively, the processor 120 may determine the capacity ratio of each battery based on the respective absolute capacities of each battery, as identified via the first fuel gauge 213 and the second fuel gauge 233. The processor 120 may calculate the capacity of the entire battery based on the residual capacity of the first battery 211 and the residual capacity of the second battery 231. The processor 120 may store the residual capacity of the first battery 211, the residual capacity of the second battery 231, and/or the capacity of the entire battery assembly (e.g., including both first and second batteries) in the memory 130.

According to certain embodiments, the processor 120 may calculate the state of health (SoH) of the first battery 211 based on the deteriorated state of the first battery 211, or may obtain the SoH of the first battery 211 from the first fuel gauge 213. The processor 120 may calculate the SoH of the second battery 231 based on the deteriorated state of the second battery 231, or may obtain the SoH of the second battery 231 from the second fuel gauge 233. The processor 120 may calculate the SoH of the entire battery (e.g., both the first and second batteries) based on the SoH of the first battery 211 and/or the SoH of the second battery 231. The processor 120 may determine whether the SoH of the first battery 211 or the SoH of the second battery 231 is less than a deterioration configuration value, or may determine whether the SoH (or entire SoH) of the entire battery is less than the deterioration configuration value. Based on a result of the determination, the processor 120 may generate a notification warning a user about the deteriorated state of the battery, or output a notification regarding the deteriorated state of the battery when receiving such a request from a user. The deteriorated state of the battery may include at least one of the deteriorated state of the entire battery, the deteriorated state of the first battery 211, or the deteriorated state of the second battery 231.

According to certain embodiments, the processor 120 may count an accumulated usage cycle corresponding to the first battery 211 based on the state information of the first battery 211, and count an accumulated usage cycle corresponding to the second battery 231 based on the state information of the second battery 231. The processor 120 may calculate the accumulated usage cycle of the entire battery based on the accumulated usage cycle of the first battery 211 or the accumulated usage cycle of the second battery 231. The processor 120 may determine whether the accumulated usage cycle of the first battery 211 or the accumulated usage cycle of the second battery 231 exceeds a deterioration usage value, or may determine whether the accumulated usage cycle (e.g., the entire accumulated usage cycle) of the entire battery exceeds the deterioration usage value. Based on a result of the determination, the processor 120 may generate a notification warning a user regarding the deteriorated state of the battery, or output a notification regarding the deteriorated state of the battery upon receiving a corresponding request from a user.

According to certain embodiments, the processor 120 may monitor a connection state of the first battery 211 based on the state information of the first battery 211, and if the connection of first battery 211 indicates a poor, incomplete or otherwise faulty connection, the processor 120 may report the same to a user. The processor 120 may monitor the connection state of the second battery 231 based on the state information of the second battery 231, and if the second battery 231 indicates a poor, incomplete or otherwise faulty connection, the processor 120 may report the same to a user. The processor 120 may output a user interface including at least one of the faulty state of the first battery 211 or the coupled state of the first battery 211, and the faulty state of the second battery 231 or the coupled state of the second battery 231.

FIG. 2B is a diagram illustrating an example in which an electronic device according to certain embodiments has a second configuration 250.

Referring to FIG. 2B, an electronic device (e.g., the electronic device 101 of FIG. 1) according to certain embodiments may include a second configuration 250 in which the first fuel gauge 213 or the first thermistor 215 are included in the first battery 211, and the second fuel gauge 233 or the second thermistor 235 are included in the second battery 231. The processor 120 may be communicably coupled via an electrical path with the power management module 188, the first fuel gauge 213, or the second fuel gauge 233. The power management module 188 may be communicably coupled via an electric path with the first fuel gauge 213, the second fuel gauge 233, the first battery 211, or the second battery 231.

The first thermistor 215 may detect the temperature of the first battery 211, and may transfer the same to the first fuel gauge 213 or the processor 120. The first fuel gauge 213 may obtain the state information of the first battery 211, and may transfer the same to the processor 120. The second thermistor 235 may detect the temperature of the second battery 231, and may transfer the same to the second fuel gauge 233 or the processor 120. The second fuel gauge 233 may obtain the state information of the second battery 231, and may transfer the same to the processor 120.

The processor 120 may store the state information of the first battery 211 obtained from the first fuel gauge 213 in a memory (e.g., the memory 130 of FIG. 1), or may calculate the residual capacity of the first battery 211 based on the state information of the first battery 211. The processor 120 may store the state information of the second battery 231 obtained from the second fuel gauge 233 in the memory 130, or may calculate the residual capacity of the second battery 231 based on the state information of the second battery 231.

According to certain embodiments, the processor 120 may obtain the SoH or the accumulated usage cycle of the first battery 211 based on the state information of the first battery 211, and may obtain the SoH or the accumulated usage cycle of the second battery 231 based on the state information of the second battery 231. The processor 120 may determine the deteriorated state of each battery based on each SoH or each accumulated usage cycle, and, based on a result of the determination, may warn about the deteriorated state of the battery to a user or may report the deteriorated state of the battery when requested by a user.

FIG. 2B indicates a different configuration from that of FIG. 2A, but other operations may be performed in the same or similar manner. Accordingly, repetitive detailed descriptions thereof will be omitted.

FIG. 2C is a diagram illustrating an example in which an electronic device according to certain embodiments has a third configuration 270.

Referring to FIG. 2C, an electronic device (e.g., the electronic device 101 of FIG. 1) according to certain embodiments may include a third configuration 270 in which the first thermistor 215 is disposed inside the first battery 211, the first fuel gauge 213 is disposed outside the first battery 211, the second thermistor 235 is disposed inside the second battery 231, and the second fuel gauge 233 is disposed outside the second battery 231. The processor 120 may be communicably coupled via an electrical path with the power management module 188, the first fuel gauge 213, or the second fuel gauge 233. The power management module 188 may be communicably coupled via an electric path with the first fuel gauge 213, the second fuel gauge 233, the first battery 211, or the second battery 231.

The first thermistor 215 may measure the temperature of the first battery 211, and may transfer the same to the first fuel gauge 213 or the processor 120. The first fuel gauge 213 may obtain the state information of the first battery 211, and may transfer the same to the processor 120. The second thermistor 235 may measure the temperature of the second battery 231, and may transfer the same to the second fuel gauge 233 or the processor 120. The second fuel gauge 233 may obtain the state information of the second battery 231, and may transfer the same to the processor 120.

The processor 120 may store the state information of the first battery 211 obtained from the first fuel gauge 213 in a memory (e.g., the memory 130 of FIG. 1), or may calculate the residual capacity of the first battery 211 based on the state information of the first battery 211. The processor 120 may store the state information of the second battery 231 obtained from the second fuel gauge 233 in the memory 130, or may calculate the residual capacity of the second battery 231 based on the state information of the second battery 231.

According to certain embodiments, the processor 120 may obtain the SoH or the accumulated usage cycle of the first battery 211 based on the state information of the first battery 211, and may obtain the SoH or the accumulated usage cycle of the second battery 231 based on the state information of the second battery 231. The processor 120 may determine the deteriorated state of each battery based on each SoH or each accumulated usage cycle, and, based on a result of the determination, may warn about the deteriorated state of the battery to a user or may report the deteriorated state of the battery when requested by a user.

FIG. 2C indicate a different configuration from that of FIG. 2A, but other operations may be performed in the same or similar manner. Accordingly, repetitive detailed descriptions thereof will be omitted.

Although FIG. 2A to 2C have described an example that uses two batteries, the electronic device 101 may include two or more batteries. The electronic device 101 may include a fuel gauge and a thermistor to correspond to a single battery. At least one of the fuel gauge or the thermistor may be included in the battery or may be disposed outside the battery.

An electronic device (e.g., the electronic device 101 of FIG. 1) according to certain embodiments of the disclosure may include a first battery (e.g., the first battery 211 of FIGS. 2A to 2C) and a second battery (e.g., the second battery 231 of FIGS. 2A to 2C), a first fuel gauge (e.g., the first fuel gauge 213 of FIGS. 2A to 2C) disposed to correspond to the first battery, a second fuel gauge (e.g., the second fuel gauge 233 of FIGS. 2A to 2C) disposed to correspond to the second battery, a memory (e.g., the memory 130 of FIG. 1), and a processor (e.g., the processor 120 of FIG. 1) operatively connected to the first battery, the second battery, the first fuel gauge, the second fuel gauge, or the memory, in which the processor is configured to obtain state information of the first battery from the first fuel gauge, to obtain state information of the second battery from the second fuel gauge, to determine a capacity ratio of each battery based on an absolute capacity of each battery identified via the first fuel gauge and the second fuel gauge, to calculate the residual capacity of the first battery or the residual capacity of the second battery based on at least one piece of information among the capacity ratio of each battery, the state information of the first battery, or the state information of the second battery, and to provide the calculated residual capacity of the first battery and the calculated residual capacity of the second battery.

The first fuel gauge is configured to be disposed inside or outside the first battery, and the second fuel gauge is configured to be disposed inside or outside the second battery.

The electronic device may further include a first thermistor (e.g., the first thermistor 215 of FIGS. 2A to 2C) disposed to correspond to the first battery, and configured to measure a temperature of the first battery, and a second thermistor (e.g., the second thermistor 235 of FIGS. 2A to 2C) disposed to correspond to the second battery, and configured to measure a temperature of the second battery.

The first thermistor is configured to be disposed inside or outside the first battery, and the second thermistor is configured to be disposed inside or outside the second battery.

The processor may be configured to calculate the residual capacity of the first battery based on a temperature of the first battery measured by a first thermistor or the state information of the first battery, and to calculate the residual capacity of the second battery based on a temperature of the second battery measured by a second thermistor or the state information of the second battery.

The processor is configured to calculate the residual capacity of entire battery based on the residual capacity of the first battery or the residual capacity of the second battery, and to provide the residual capacity of the entire battery.

The processor is configured to calculate the residual capacity of entire battery based on the state of charging (SoC) of the first battery included in the state information of the first battery or the SoC of the second battery included in the state information of the second battery, and to provide the residual capacity of the entire battery.

The processor is configured to obtain the state of health (SoH) of the first battery from the first fuel gauge, to obtain an SoH of the second battery from the second fuel gauge, and to calculate the SoH of entire battery based on the each SoC.

The processor is configured to determine whether the SoH of the first battery, the SoH of the second battery, or the SoH of the entire battery is less than a deterioration configuration value, and based on a result of the determination, to notify of the deteriorated state of the battery.

The processor is configured to count an accumulated usage cycle corresponding to the first battery based on the state information of the first battery, to count an accumulated usage cycle corresponding to the second battery based on the state information of the second battery, and to calculate an accumulated usage cycle of entire battery based on the each accumulated usage cycle.

The processor is configured to determine whether the accumulated usage cycle of the first battery, the accumulated usage cycle of the second battery, or the accumulated usage cycle of the entire battery exceeds a usage amount value as a deterioration usage value, and based a result of the determination, to notify of the deteriorated state of the battery.

If the electronic device is foldable along a folding axis so that a first housing and a second housing are folded, the first battery is disposed in the first housing and the second battery is disposed in the second housing.

If a second housing is formed to be accommodated inside a first housing of the electronic device, the first battery is configured to be disposed in the first housing and the second battery is configured to be disposed in the second housing.

Figure 3:
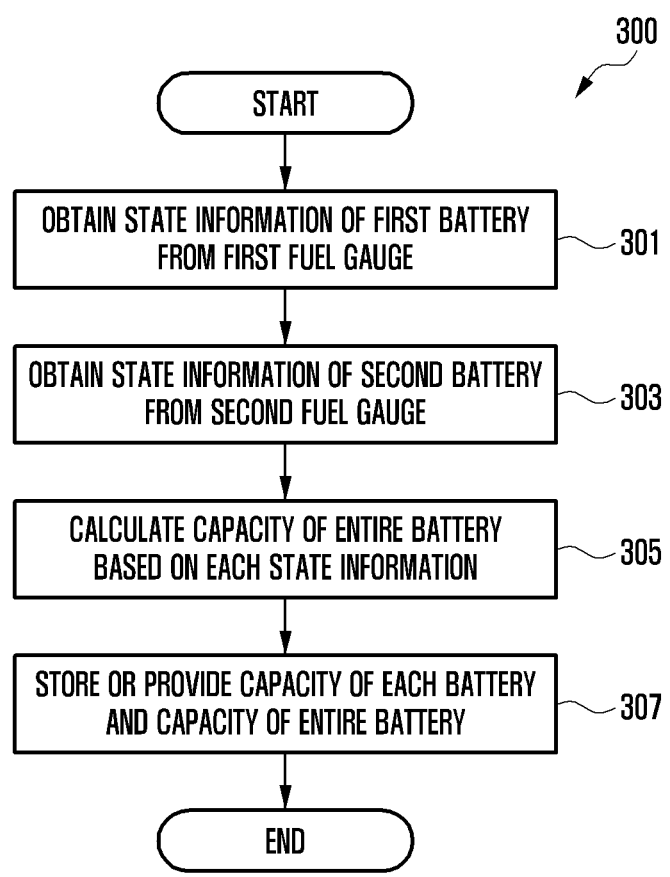
FIG. 3 is a flowchart illustrating an operation method of an electronic device according to certain embodiments.

FIG. 3 is a flowchart 300 illustrating an operation method of an electronic device according to certain embodiments.

Referring to FIG. 3, in operation 301, a processor (e.g., the processor 120 of FIG. 1) of an electronic device (e.g., the electronic device 101 of FIG. 1) according to certain embodiments may obtain the state information of a first battery (e.g., the first battery 211 of FIGS. 2A to 2C) from a first fuel gauge (e.g., the first fuel gauge 213 of FIGS. 2A to 2C). The state information of the first battery 211 may include at least one of a temperature, a charging current, a discharging current, a faulty state, a coupled state, a residual capacity, an SoC, an accumulated usage cycle, an OCV, or a deteriorated state associated with the first battery 211. The first fuel gauge 213 may be disposed inside or outside the first battery 211.

The first fuel gauge 213 may obtain the temperature of the first battery 211 from a first thermistor (e.g., the first thermistor 215 of FIGS. 2A to 2C) disposed inside or outside the first battery 211. The first thermistor 215 may monitor the temperature of the first battery 211, and may transfer the temperature of the first battery 211 to the first fuel gauge 213 periodically or in real time. The first fuel gauge 213 may calculate a residual capacity based on the temperature of the first battery 211. Alternatively, the processor 120 may calculate the residual capacity of the first battery 211 based on the state information of the first battery 211.

In operation 303, the processor 120 may obtain the state information of a second battery (e.g., the second battery 231 of FIGS. 2A to 2C) from a second fuel gauge (e.g., the second fuel gauge 233 of FIGS. 2A to 2C). The state information of the second battery 231 may include at least one of a temperature, a charging current, a discharging current, a faulty state, a coupled state, a residual capacity, an SoC, an accumulated usage cycle, an OCV, or a deteriorated state associated with the second battery 231. The second fuel gauge 233 may be disposed inside or outside the second battery 231. The second fuel gauge 233 may obtain the temperature of the second battery 231 from a second thermistor (e.g., the second thermistor 235 of FIGS. 2A to 2C) disposed inside or outside the second battery 231. The second fuel gauge 233 may calculate a residual capacity based on the temperature of the second battery 231. Alternatively, the processor 120 may calculate the residual capacity of the second battery 231 based on the state information of the second battery 231.

In operation 305, the processor 120 may calculate the capacity of entire battery (e.g., both the first and second battery) based on each piece of state information. The processor 120 may calculate the capacity of entire battery based on the state information of the first battery 211 and/or the state information of the second battery 231. For example, if the total capacity of the first battery 211 is 4500 mAh and the total capacity of the second battery 231 is 1500 mAh, the capacity ratio of the first battery 211 is 3, the capacity ratio of the second battery 231 is 1, and the capacity of the entire battery is 6000 mAh. The processor 120 may calculate, based on the state information of the first battery 211, 2250 mAh as the residual capacity of the first battery 211, and may calculate, based on the state information of the second battery 231, 750 mAh as the residual capacity of the second battery 231. Based on the residual capacity (e.g., 2250 mAh) of the first battery 211 and the residual capacity (e.g., 750 mAh) of the second battery 231, the processor 120 may calculate the residual capacity (e.g., (2250+750)/6000=50%=3000 mAh)) of the entire battery. Alternatively, the processor 120 may calculate the residual capacity of the entire battery (e.g., (3*50%+1*50%)/(3+1)=200%/4=50%)) based on at least one of the capacity ratio (e.g., 3) of the first battery 211, the SoC (e.g., 50%) of the first battery 211, the capacity ratio (e.g., 1) of the second battery 231, and the SoC (e.g., 50%) of the second battery 231.

In operation 307, the processor 120 may store the residual capacity of each battery and the residual capacity of the entire battery in a memory (e.g., the memory 130 of FIG. 1), and may provide the same to a user. At least one of the capacity ratio of the first battery 211, the capacity ratio of the second battery 231, the residual capacity of the first battery 211, the residual capacity of the second battery 231, or the residual capacity of the entire battery may be stored in the memory 130 as battery information. If a user input for identifying the state of a battery is detected, the processor 120 may display a user interface including battery information stored in the memory 130 via a display (e.g., the display module 160 of FIG. 1) based on the detected user input.

The user interface may include the residual capacity of the entire battery, or may include each of the residual capacity of the first battery 211 or the residual capacity of the second battery 231. Alternatively, if at least one of the residual capacity of the first battery 211, the residual capacity of the second battery 231, or the residual capacity of the entire battery is less than a reference residual value (e.g., 20%, 10%), the processor 120 may display, via the display module 160, a user interface including battery information stored in the memory 130. If at least one of the residual capacity of the first battery 211, the residual capacity of the second battery 231, or the residual capacity of the entire battery is less than a reference residual value (e.g., 20%, 10%), the processor 120 may provide battery information in the form of a pop-up window.

According to certain embodiments, if a user request is detected (e.g., requesting a status check of the health of a battery), or if the deteriorated state of a battery is less than a deterioration reference value, the processor 120 may output a notification indicating the deteriorated state of the battery. A detailed example that provides the deteriorated state of a battery will be described in detail with reference to FIGS. 4 and 6.

According to certain embodiments, the processor 120 may monitor the faulty state (or malfunction) or the coupled state of the first battery 211 based on the state information of the first battery 211, and if the first battery 211 is in the faulty state or the coupled state is faulty, the processor 120 may report the same to a user. If the processor 120 detects a malfunction, such as the case in which the residual capacity of the first battery 211 is greater than the entire capacity of the first battery 211, or the case in which the residual capacity of the first battery 211 does not change in the state of being charged or discharged, the processor 120 may determine that the first battery 211 in an faulty state. Alternatively, if an electrical path with the first battery 211 has a problem, the processor 120 may determine that the coupled state of the first battery 211 is in the faulty state.

If signal exchange with the first battery 211 does not proceed, the processor 120 may determine that the electrical path has a problem. The processor 120 may monitor the faulty state (or malfunction) or the coupled state of the second battery 231 based on the state information of the second battery 231, and if the second battery 231 is in the faulty state or the coupled state is faulty, the processor 120 may report the same to a user. The processor 120 may display, via the display module 160, a user interface including at least one of the faulty state of the first battery 211 or the coupled state of the first battery 211, or the faulty state of the second battery 231 or the coupled state of the second battery 231.

Figure 4:
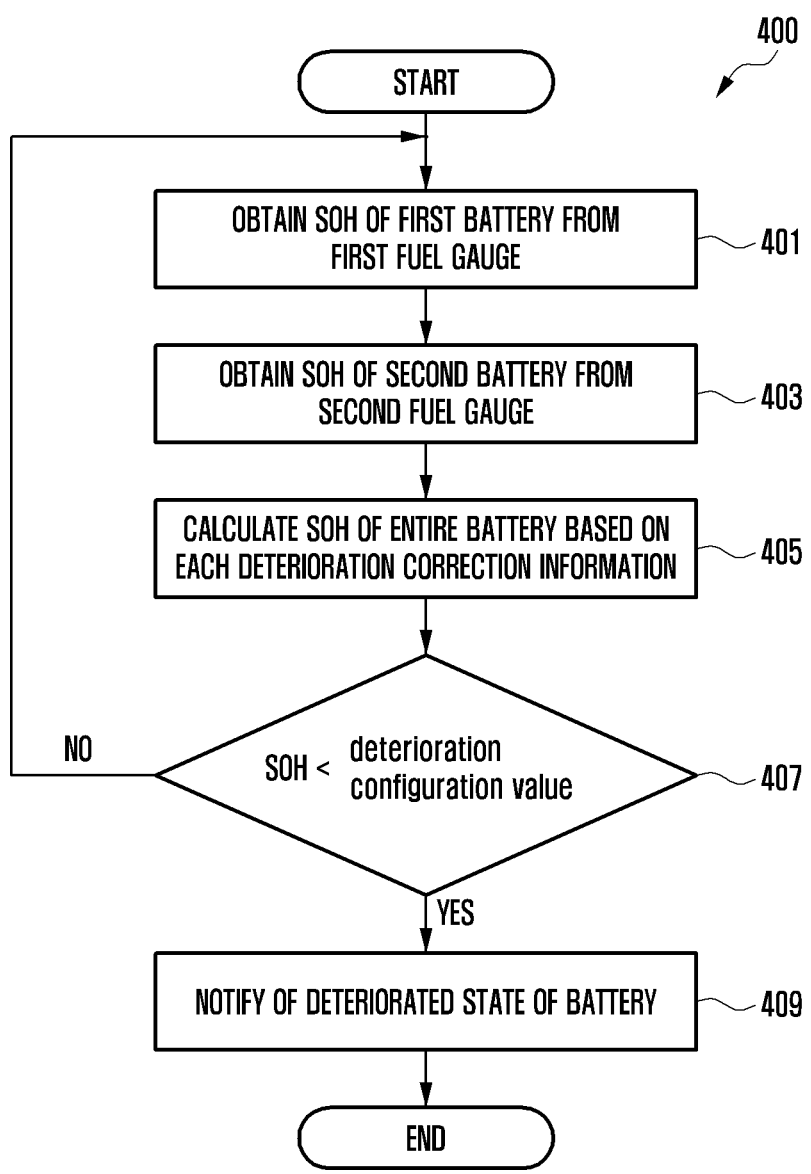
FIG. 4 is a flowchart illustrating a method of reporting the deteriorated state of a battery of an electronic device according to certain embodiments.

FIG. 4 is a flowchart 400 illustrating a method of reporting the deteriorated state of a battery of an electronic device according to certain embodiments.

Referring to FIG. 4, in operation 401, a processor (e.g., the processor 120 of FIG. 1) of an electronic device (e.g., the electronic device 101 of FIG. 1) according to certain embodiments may obtain the SoH of a first battery (e.g., the first battery 211 of FIGS. 2A to 2C) from a first fuel gauge (e.g., the first fuel gauge 213 of FIGS. 2A to 2C). The SoH may be obtained based on the residual capacity of the first battery 211 in consideration of a deteriorated state (or deteriorated value) of the first battery 211. After a battery is charged up to 100%, the actual usable capacity of the battery may be calculated in consideration of the deteriorated state of the battery. The SoH of the first battery 211 may be a usable capacity obtained in consideration of the deteriorated state of the first battery 211. For example, if the SoH of the first battery 211 is 70%, it is understood that the first battery 211 has a 70% battery life at maximum charge relative to a new battery, even though the first battery 211 is presently charged to 100%. The deteriorated state of the first battery 211 may be included in the state information of the first battery 211. The processor 120 may store the SoH of the first battery 211 in a memory (e.g., the memory 130 of FIG. 1).

According to certain embodiments, the first fuel gauge 213 may directly calculate an SoH and may transfer the same to the processor 120, or the processor 120 may directly calculate the SoH of the first battery 211 based on the accumulated usage cycle of the first battery 211. FIG. 4 illustrates an example of obtaining an SoH from the first fuel gauge 213.

In operation 403, the processor 120 may obtain the SoH of a second battery (e.g., the second battery 231 of FIGS. 2A to 2C) from a second fuel gauge (e.g., the second fuel gauge 233 of FIGS. 2A to 2C). The SoH may be obtained based on the residual capacity of the second battery 231 in consideration of the deteriorated state (or deteriorated value) of the second battery 231. The second fuel gauge 233 may directly calculate the SoH of the second battery 231, and may transmit the same to the processor 120. The processor 120 may store the SoH of the second battery 231 in the memory 130.

In operation 405, the processor 120 may calculate the SoH of the entire battery based on each piece of SoH. The processor 120 may store at least one information among the capacity of the entire battery, the capacity ratio of the first battery 211, or the capacity ratio of the second battery 231 in the memory 130. The processor 120 may calculate the SoH of the entire battery (e.g., (3*88.8%+1*66.6%)/(3+1) =333%/4=83.25%) based on at least one of the SoH (e.g., 88.8%) of the first battery 211, the capacity ratio (e.g., 3) of the first battery 211, the SoH (e.g., 66.6%) of the second battery 231, and the capacity ratio (e.g., 1) of the second battery 231.

In operation 407, the processor 120 may determine whether an SoH is less than a deterioration configuration value. The deterioration configuration value may be set according to a state (e.g., time) in which a battery should be replaced. The deterioration configuration value may be configured in the electronic device 101 as a default value in advance of the status check, or may be configured by a user. The processor 120 may determine whether any one of the SoH of the first battery 211 or the SoH of the second battery 231 is less than the deterioration configuration value, or may determine whether the SoH of the entire battery is less than the deterioration configuration value.

The processor 120 may proceed with operation 409 if the SoH is less than the deterioration configuration value, and may proceed with operation 401 if the SoH is greater than or equal to the deterioration configuration value. If the SoH is greater than or equal to the deterioration configuration value, the processor 120 may return to operation 401, and may monitor the SoH of the first battery 211 or the SoH of the second battery 231.

If the SoH is less than the deterioration configuration value, the processor 120 may output a notification indicating the deteriorated state of the battery in operation 409. The deteriorated state of the battery may include at least one of the deteriorated state of the first battery 211, the deteriorated state of the second battery 231, or the deteriorated state of the entire battery. If the SoH is less than the deterioration configuration value, the processor 120 may determine that the battery is in a deteriorated state, and may output a warning notification that warns about the deteriorated state of the battery. The warning notification be provided in the form of a pop-up window via a display (e.g., the display module 160 of FIG. 1), in order to prompt a user to replace the battery. Alternatively, the warning notification may include at least one of a sound, text, an image, or a video. If a user input requesting identification of the deteriorated state of a battery is detected, the processor 120 may display a user interface indicating the deteriorated state of a battery stored in the memory 130 via the display module 160 based on the detected user input.

Figure 5:
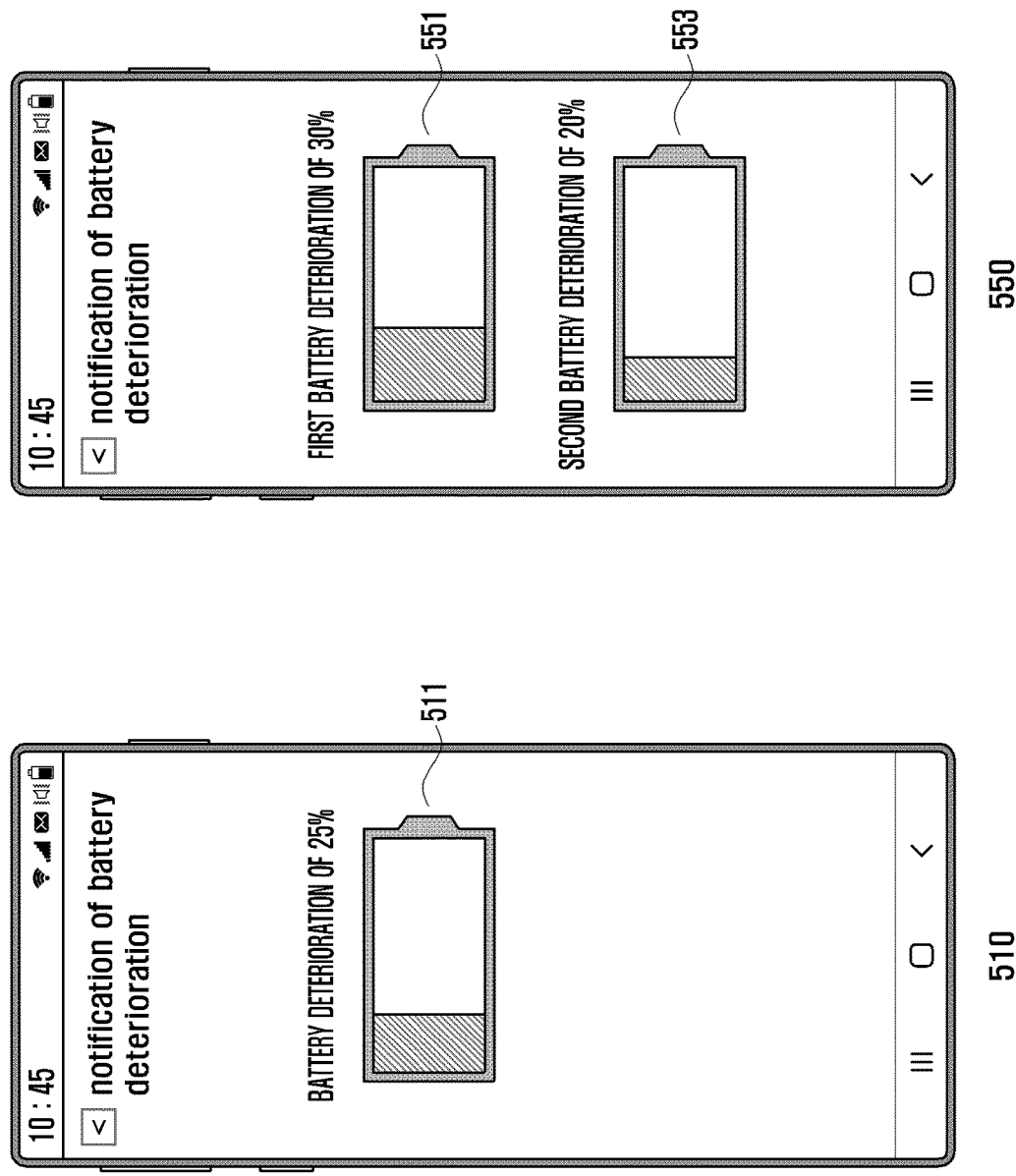
FIG. 5 is a diagram illustrating a user interface that reports the deteriorated state of a battery of an electronic device according to certain embodiments.

FIG. 5 is a diagram illustrating a user interface that reports the deteriorated state of a battery of an electronic device according to certain embodiments.

Referring to FIG. 5, a processor (e.g., the processor 120 of FIG. 1) of an electronic device (e.g., the electronic device 101 of FIG. 1) according to various embodiment may display, via a display (e.g., the display module 160 of FIG. 1), a first user interface 510 reporting on the deteriorated state of an entire battery. The first user interface 510 may report a deteriorated state 511 of the entire battery (e.g., both the first battery and second battery, and any other batteries of the device). The first user interface 510 may include at least one of text, an image, or a video. The processor 120 may display the first user interface 510, and may output a sound indicating the deteriorated state 511 of the entire battery via a speaker (e.g., the sound output device 155 of FIG. 1). Alternatively, the processor 120 may display a second user interface 550 indicating the deteriorated state of each battery via the display module 160. The second user interface 550 may utilize separated reports, including a deteriorated state 551 of a first battery (e.g., the first battery 211 of FIGS. 2A to 2C) and a separate deteriorated state 553 of a second battery (e.g., the second battery 231 of FIGS. 2A to 2C).

Figure 6:
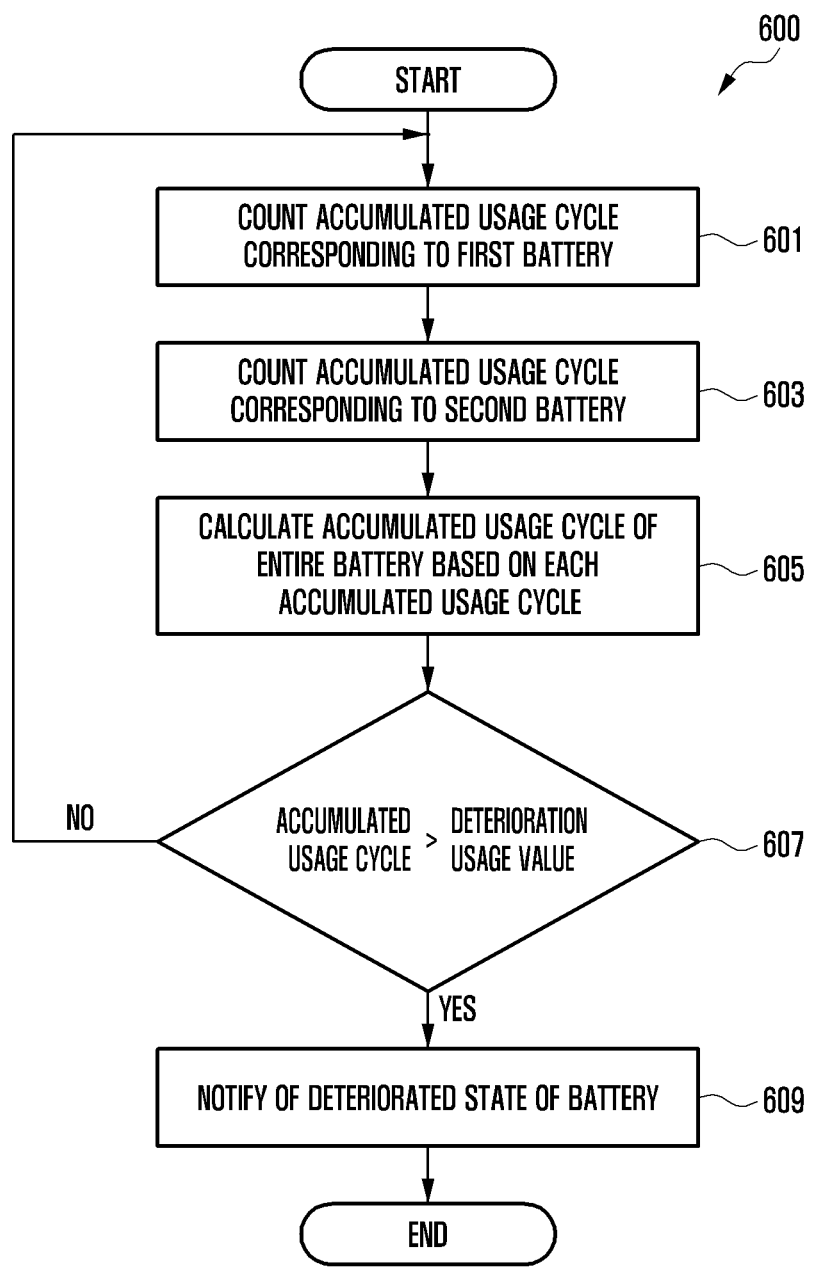
FIG. 6 is a flowchart illustrating a method of reporting the deteriorated state of a battery of an electronic device according to certain embodiments.

FIG. 6 is a flowchart 600 illustrating a method of reporting the deteriorated state of a battery of an electronic device according to certain embodiments.

Referring to FIG. 6, in operation 601, a processor (e.g., the processor 120 of FIG. 1) of an electronic device (e.g., the electronic device 101 of FIG. 1) according to certain embodiments may count the accumulated usage cycle corresponding to a first battery (e.g., the first battery 211 of FIGS. 2A to 2C). The accumulated usage cycle may count lifetime charge cycles in which the first battery was charged and discharged, and may increment by 1 every time that the first battery 211 is discharged to 0% after being charged to 100%. The processor 120 may obtain the state information of the first battery 211 from a first fuel gauge (e.g., the first gauge 213 of FIGS. 2A to 2C), and may count the accumulated usage cycle corresponding to the first battery 211 based on the state information of the first battery 211. Alternatively, based on the state information of the first battery 211 or the capacity ratio of the first battery 211 stored in a memory (e.g., the memory 130 of FIG. 1), the processor 120 may count an accumulated usage cycle corresponding to the first battery 211.

In operation 603, the processor 120 may count an accumulated usage cycle corresponding to a second battery (e.g., the second battery 231 of FIGS. 2A to 2C). The processor 120 may obtain the state information of the second battery 231 from a second fuel gauge (e.g., the second fuel gauge 233 of FIGS. 2A to 2C), and may count an accumulated usage cycle corresponding to the second battery 231 based on the state information of the second battery 231.

In operation 605, the processor 120 may calculate the accumulated usage cycle of the entire battery (e.g., both the first and second batteries) based on the each accumulated usage cycle. Based on at least one of the state information of the first battery 211, the capacity ratio of the first battery 211, the state information of the second battery 231, or the capacity ratio of the second battery 231, the processor 120 may calculate the accumulated usage cycle of the entire battery.

In operation 607, the processor 120 may determine whether the accumulated usage cycle exceeds a deterioration usage value. The deterioration usage value may be configured to indicate a time at which a battery should be replaced. The deterioration usage value may be configured in advance in the electronic device 101 as a default value, or may be configured by a user. The processor 120 may determine whether any one of the accumulated usage cycle of the first battery 211 or the accumulated usage cycle of the second battery 231 exceeds the deterioration usage value, or may determine whether the accumulated usage cycle of the entire battery exceeds the deterioration usage value.

If the accumulated usage cycle exceeds the deterioration usage value, the processor 120 may proceed with operation 609, and if the accumulated usage cycle is less than or equal to the deterioration usage value, the processor 120 may return to operation 601. If the accumulated usage cycle is less than or equal to the deterioration usage value, the processor 120 returns to operation 601, and may continue to count (or monitor) the accumulated usage cycle of the first battery 211 and the accumulated usage cycle of the second battery 231.

If the accumulated usage cycle exceeds the deterioration usage value (e.g., a threshold number of cycles), the processor 120 may output a notification indicating the deteriorated state of the battery in operation 609. The deteriorated state of the battery may include at least one of the deteriorated state of the first battery 211, the deteriorated state of the second battery 231, or the deteriorated state of the entire battery. If the accumulated usage cycle exceeds the deterioration usage value, the processor 120 may determine that the battery is in a deteriorated state, and may output a notification warning a user regarding the deteriorated state of the battery. If a user input is detected requesting identification of the deteriorated state of a battery, the processor 120 may display a user interface including the deteriorated state of a battery stored in the memory 130 via the display module 160 based on the detected user input. Operation 609 is the same as, or similar to, operation 409 of FIG. 4, and thus, detailed descriptions thereof will be omitted.

Figure 7:
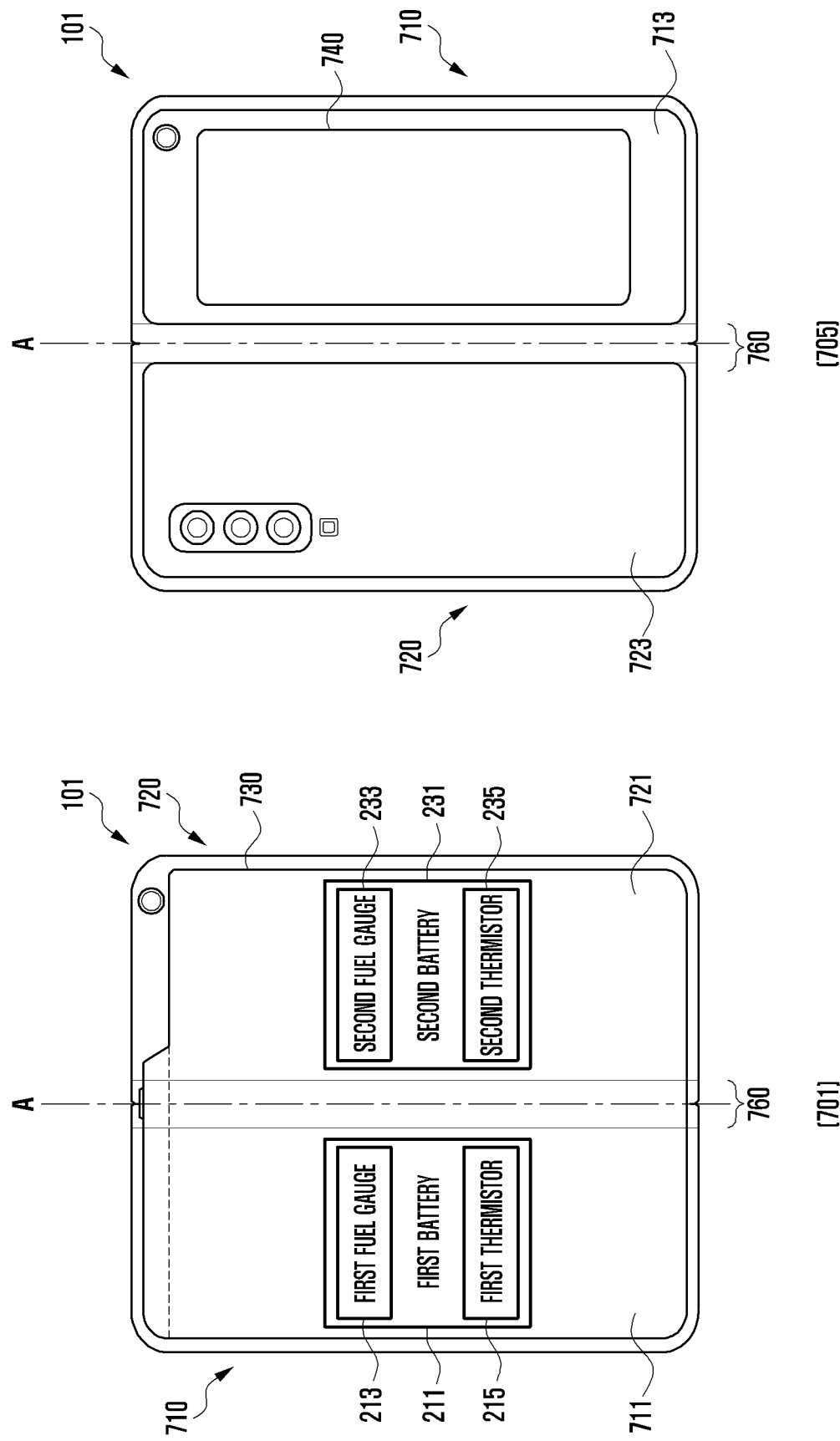
FIG. 7 is a diagram illustrating the configuration of a battery, a fuel gauge, and a thermistor of a foldable electronic device according to certain embodiments.

FIG. 7 is a diagram illustrating the configuration of a battery, a fuel gauge, and a thermistor of a foldable electronic device according to certain embodiments.

Referring to FIG. 7, a foldable electronic device (e.g., the electronic device 101 of FIG. 1) according to certain embodiments is illustrated, and may include a first housing 710 including a first side 711 and a third side 713, and a second housing 720 including a second side 721 and a fourth side 723. The first side 711 of the first housing 710 and the second side 721 of the second housing 720 correspond to a front side 701 of the electronic device 101, and the third side 713 of the first housing 710 and a fourth side 723 of the second housing 720 correspond to a back side 705 of the electronic device 101.

The first housing 710 and the second housing 720 may form opposite sides of the device relative to a central a folding axis (e.g., A axis), and in some embodiments may render the device symmetrical relative to the folding axis. The first housing 710 and the second housing 720 may be folded so as to face each other. A hinge structure 760 may be included between the first housing 710 and the second housing 720, allowing folding of the front side 701 of the electronic device 101. The angle or the distance between the first housing 710 and the second housing 720 may differ depending on whether the electronic device 101 is in an open state, in a closed state, or in an intermediate state.

For example, the open state may include a flat state, or an unfolded state. In the open state, the first housing 710 and the second housing 720 may be aligned with each other, in which the electronic device 101 is fully folded out. In this state, the angle between the first housing 710 and the second housing 720 is 180 degrees, and the first side 711 of the first housing 710 and the second side 721 of the second housing 720 are disposed to be oriented in the same direction. The drawing illustrates the front side 701 of the electronic device 101 and the back side 705 of the electronic device 101 when the electronic device 101 is in the open state.

The closed state may be a folded state. In the closed state, the first housing 710 and the second housing may be disposed so as to face each other, such that the electronic device 101 is completely folded. In this state, the angle between the first housing 710 and the second housing 720 is a narrow angle (e.g., 0 to 5 degrees), and the first side 711 of the first housing 710 and the second side 721 of the second housing 720 may face to each other. In the drawing, the illustrated electronic device 101 utilizes an in-folding scheme. However, another example electronic device 101 of may utilize an out-folding scheme, in the same or similar manner.

The intermediate state is a configuration in which the first housing 710 and the second housing 720 are disposed to have a predetermined angle therebetween, such that electronic device 101 is neither in the open or closed state. The intermediate state may be the state in which the first side 711 of the first housing 710 and the second side 721 of the second housing 720 have a predetermined angle (e.g., roughly 6 to 179 degrees) therebetween.

The electronic device 101 may include a first display 730 (e.g., a main display) (e.g., the display module 160 of FIG. 1) in the first side 711 and the second side 721 that correspond to the front side 701 of the electronic device. The first display 730 may be formed in the whole of the front side 701. The first display 730 may be a flexible display of which at least a part is capable of being changed to be a flat surface or a curved surface. The first display 730 may be folded to the right or left based on the folding axis (e.g., A axis). In addition, the electronic device 101 may include a second display 740 (e.g., a sub-display, a cover display) (e.g., the display module 160 of FIG. 1) in a part of the back side 705 of the electronic device. The second display 740 may be disposed in at least a part of the third side 713 of the electronic device 101.

According to certain embodiments, the first housing 710 may include a first battery (e.g., the first battery 211 of FIGS. 2A to 2C) in the first housing 710, and a second battery (e.g., the second battery 231 of FIGS. 2A to 2C) in the second housing 720. The capacities of the first battery 211 and the second battery 231 may be the same or may be different from each other. The capacity ratio of the first battery 211 or the capacity ratio of the second battery 231 may be stored in a memory (e.g., the memory 130 of FIG. 1). Alternatively, the processor 120 may determine the capacity ratio of each battery based on the absolute capacity of each battery identified via the first fuel gauge 213 and the second fuel gauge 233.

A first fuel gauge (e.g., the first fuel gauge 213 of FIGS. 2A to 2C) or a first thermistor (e.g., the first thermistor 215 of FIGS. 2A to 2C) that corresponds to the first battery 211 may be included in the first housing 710. Although it is illustrated that the first fuel gauge 213 and the first thermistor 215 are included in the first battery 211 in the drawing, any one of the first fuel gauge 213 or the first thermistor 215 may be disposed inside or outside the first battery 211 as illustrated in FIG. 2A or FIG. 2C. A second fuel gauge (e.g., the second fuel gauge 233 of FIGS. 2A to 2C) or a second thermistor (e.g., the second thermistor 235 of FIGS. 2A to 2C) that corresponds to the second battery 231 may be included in the second housing 720.

Figure 8:
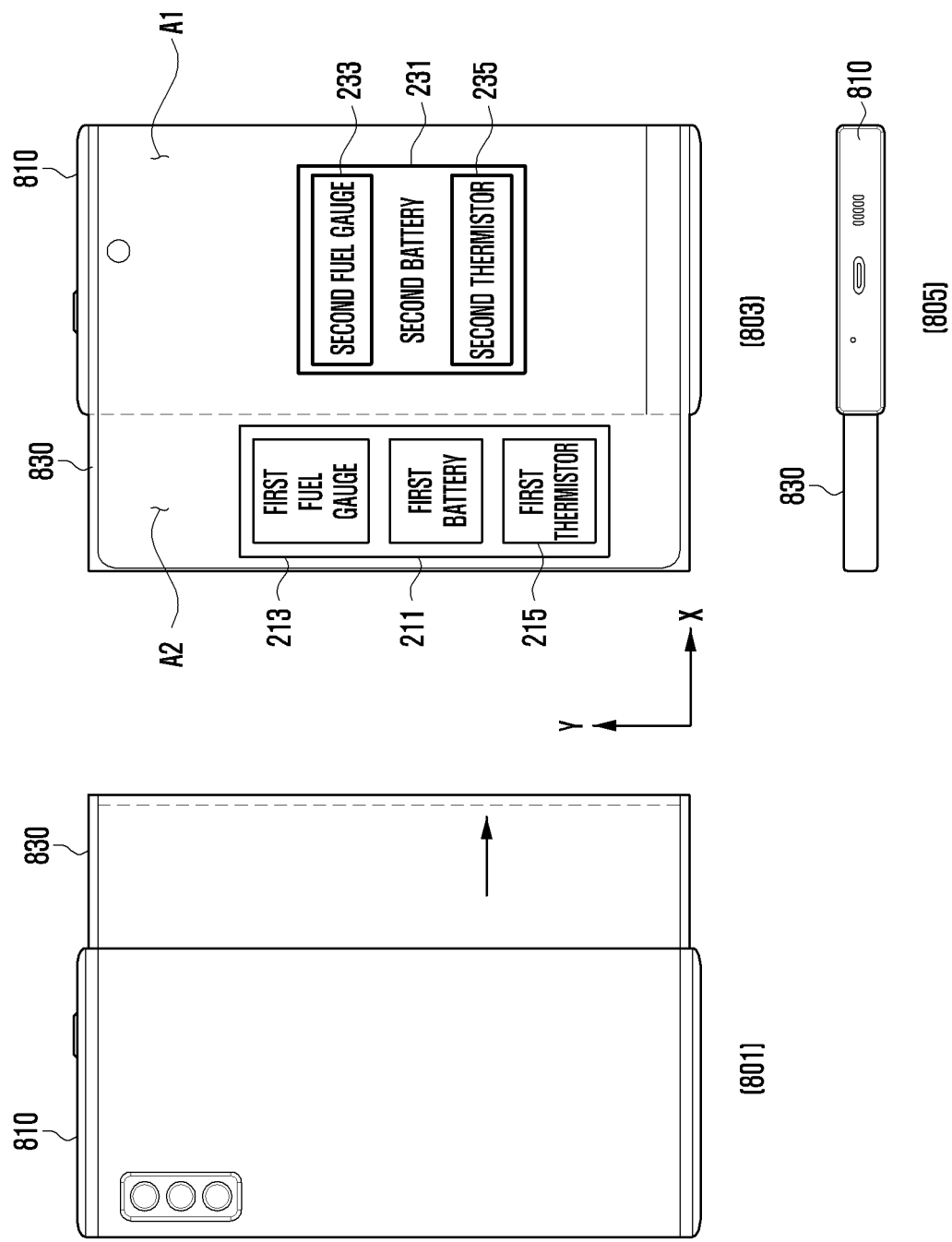
FIG. 8 is a diagram illustrating the configuration of a battery, a fuel gauge, and a thermistor of a slidable electronic device according to certain embodiments.

FIG. 8 is a diagram illustrating the configuration of a battery, a fuel gauge, and a thermistor of a slidable electronic device according to certain embodiments.

Referring to FIG. 8, a foldable electronic device (e.g., the electronic device 101 of FIG. 1) according to certain embodiments may include a first housing 810 and a second housing 830, and when the electronic device 101 is in the closed state, the second housing 830 may be inserted as to be stowed within the first housing 810 (e.g., as with a pocket type device). The first housing 810 may be a main housing of the electronic device 101, and may accommodate various electric and electronic components, for example, a main circuit board or a battery. The first housing 810 may be fixed, and the second housing 830 may be disposed to enable a reciprocating motion within a predetermined distance in a designated direction (e.g., -x axis direction (D)) from the first housing 810. The second housing 830 may be slidable relative to the first housing 810. A sliding structure enabling sliding of the second housing 830 t may be affixed between the first housing 810 and the second housing 830. The sliding structure may include, for example, a guide rail, and a slide or a roller that moves by being guided by the guide rail. The sliding structure may be embodied in various other schemes.

The front side 803 of the electronic device 101 may support a flexible display (e.g., the display module 160 of FIG. 1), which is exposed when the electronic device 101 is in the open state, and the back side 801 of the electronic device 801 may support a display module 160 that is not exposed when the electronic device 101 is in the open state. A lateral side 805 of the electronic device 101 may have a short length and form two parallel sides of the electronic device 101, and support disposition thereon of a microphone, a connector hole, or a speaker.

The display module 160 may be included in the first housing 810 and the second housing 830. When the electronic device 101 is in the closed state, a first area (A1) of the display module 160 may be exposed via the front side of the first housing 810, and a second area (A2) of the display module 160 may be stowed in the back side of the second housing 830. The first area (A1) may be fixed in the first housing 810, and the second area (A2) may be stowed in the back side of the second housing 830 or may be moved to the front side of the second housing 830.

For example, when the electronic device 101 is in the closed state, the first area (A1) may be oriented in a first direction (e.g., the front side), and the second area (A2) may be stowed in the back side of the second housing 830, and may be oriented in a second direction (e.g., the back side). If the second area (A2) is stowed in the back side of the second housing 830, the second area (A2) may not be exposed. Alternatively, if the back sides of the first housing 810 and the second housing 830 are formed as a transparent cover, the second area (A2) may be exposed via the back sides of the first housing 810 and the second housing 830 even while the second area (A2) is stowed in the back side of the second housing 830.

For example, the second area (A2) may include a part thereof that bends according to a change in the state of the electronic device 101, such as for example, a bendable area or a bendable section. As the second housing 830 moves (e.g., performs a sliding motion) with respect to the first housing 810, the second area A2 may be stowed in the back side of the second housing 830 (e.g., a slide-in motion) or may be extracted out to the front side of the second housing 830 (e.g., a slide-out motion).

According to certain embodiments, a first battery (e.g., the first battery 211 of FIGS. 2A to 2C) may be included in the second housing 830, and a second battery (e.g., the second battery 231 of FIGS. 2A to 2C) may be included in the first housing 810. The capacities of the first battery 211 and the second battery 231 may be the same or may be different from each other. The capacity ratio of the first battery 211 or the capacity ratio of the second battery 231 may be stored in a memory (e.g., the memory 130 of FIG. 1). Alternatively, the processor 120 may determine the capacity ratio of each battery based on the absolute capacity of each battery identified via the first fuel gauge 213 and the second fuel gauge 233.

A first fuel gauge (e.g., the first fuel gauge 213 of FIGS. 2A to 2C) or a first thermistor (e.g., the first thermistor 215 of FIGS. 2A to 2C) corresponding to the first battery 211 may be included in the second housing 830. Although it is illustrated that the first fuel gauge 213 and the first thermistor 215 are included in the first battery 211 in the drawing, any one of the first fuel gauge 213 or the first thermistor 215 may be disposed inside or outside the first battery 211 as illustrated in FIG. 2A or FIG. 2C. A second fuel gauge (e.g., the second fuel gauge 233 of FIGS. 2A to 2C) or a second thermistor (e.g., the second thermistor 235 of FIGS. 2A to 2C) that corresponds to the second battery 231 may be included in the first housing 810.

Figure 9:
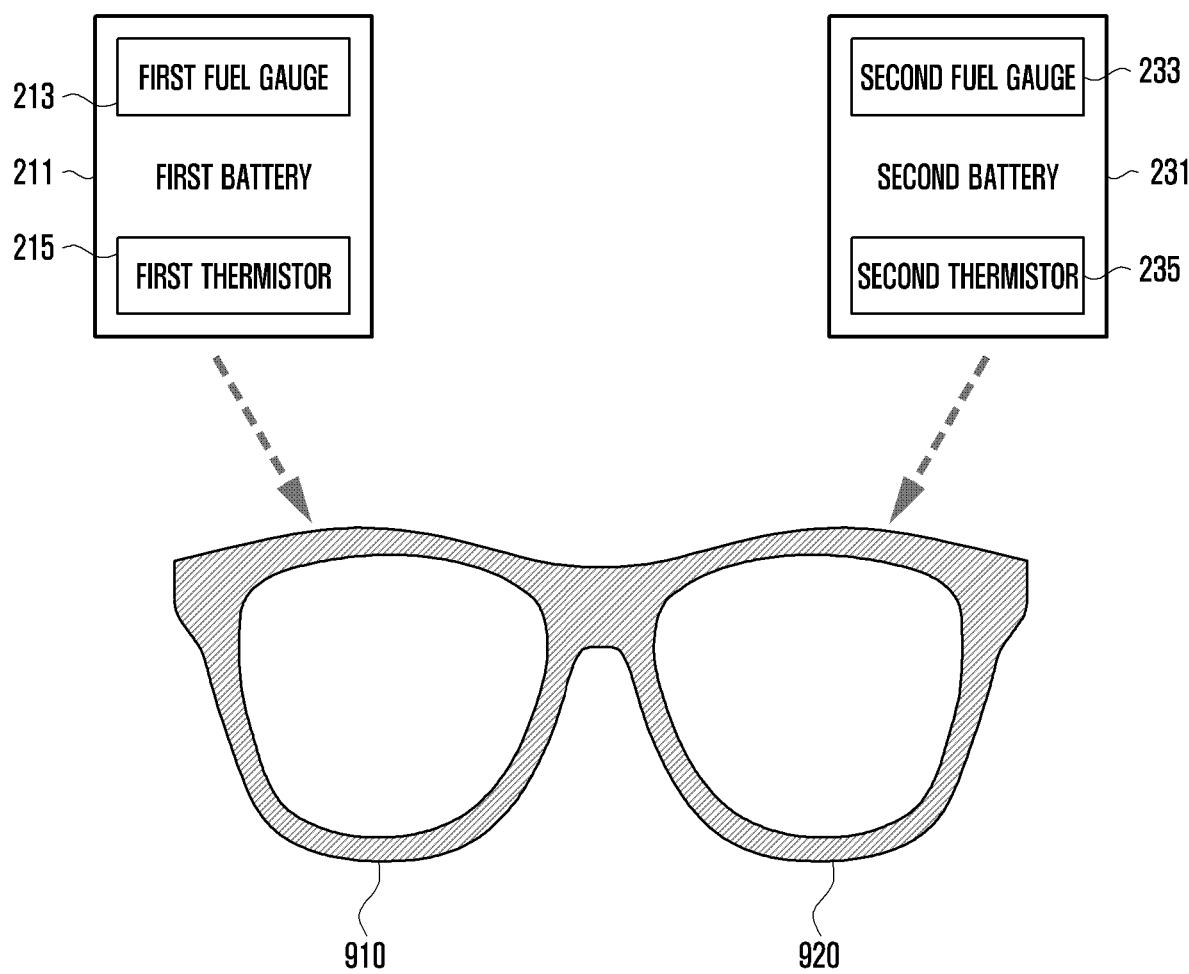
FIG. 9 is a diagram illustrating the configuration of a battery, a fuel gauge, and a thermistor of a glasses-type electronic device according to certain embodiments.

FIG. 9 is a diagram illustrating the configuration of a battery, a fuel gauge, and a thermistor of a glasses-type electronic device according to certain embodiments.

Referring to FIG. 9, a glasses-type electronic device (e.g., the electronic device 101 of FIG. 1) according to certain embodiments may include a first display module 910 and a second display module 920. The glasses-type electronic device is a wearable display device, such as a glasses-type device such as AR glasses, smart glasses, or a head mounted device (e.g., a head mounted display (HMD)).

According to certain embodiments, a first battery (e.g., the first battery 211 of FIGS. 2A to 2C) may be included in the first display module 910, and a second battery (e.g., the second battery 231 of FIGS. 2A to 2C) may be included in the second display module 920. The capacities of the first battery 211 and the second battery 231 may be the same as or may be different from each other. The capacity ratio of the first battery 211 or the capacity ratio of the second battery 231 may be stored in a memory (e.g., the memory 130 of FIG. 1). Alternatively, the processor 120 may determine the capacity ratio of each battery based on the absolute capacity of each battery identified via the first fuel gauge 213 and the second fuel gauge 233.

A first fuel gauge (e.g., the first fuel gauge 213 of FIGS. 2A to 2C) or a first thermistor (e.g., the first thermistor 215 of FIGS. 2A to 2C) that corresponds to the first battery 211 may be included in the first display module 910. Although it is illustrated that the first fuel gauge 213 and the first thermistor 215 are included within the first battery 211 in FIG. 9, any one of the first fuel gauge 213 or the first thermistor 215 may be disposed inside or outside the first battery 211 as illustrated in FIG. 2A or FIG. 2C. A second fuel gauge (e.g., the second fuel gauge 233 of FIGS. 2A to 2C) or a second thermistor (e.g., the second thermistor 235 of FIGS. 2A to 2C) that corresponds to the second battery 231 may be included in the second display module 920.

An operation method of an electronic device (e.g., the electronic device 101 of FIG. 1) including a first battery (e.g., the first battery 211 of FIGS. 2A to 2C) and a second battery (e.g., the second battery 231 of FIGS. 2A to 2C) may include an operation of obtaining the state information of the first battery from a first fuel gauge (e.g., the first fuel gauge 213 of FIGS. 2A to 2C) disposed to correspond to the first battery, an operation of obtaining the state information of the second battery from a second fuel gauge (e.g., the second fuel gauge 233 of FIGS. 2A to 2C) disposed to correspond to the second battery, an operation of determining a capacity ratio of each battery via an absolute capacity of each battery identified via the first fuel gauge and the second fuel gauge, an operation of calculating the residual capacity of the first battery or the residual capacity of the second battery based on at least one piece of information among the capacity ratio of each battery, the state information of the first battery, or the state information of the second battery, and an operation of providing the calculated residual capacity of the first battery or the calculated residual capacity of the second battery.

The operation of calculating may include an operation of calculating the residual capacity of the first battery based on a temperature of the first battery measured by a first thermistor or the state information of the first battery, and an operation of calculating the residual capacity of the second battery based on a temperature of the second battery measured by a second thermistor or the state information of the second battery.

The method may further include an operation of calculating the residual capacity of the entire battery based on the residual capacity of the first battery or the residual capacity of the second battery, and an operation of providing the residual capacity of the entire battery.

The method may further include an operation of calculating the residual capacity of the entire battery based on the state of charging (SoC) of the first battery included in the state information of the first battery or the SoC of the second battery included in the state information of the second battery, and an operation of providing the residual capacity of the entire battery.

The method may include an operation of obtain the state of health (SoH) of the first battery from the first fuel gauge, an operation of obtaining the SoH of the second battery from the second fuel gauge, and an operation of calculating the SoH of entire battery based on the each SoH.

The method may include an operation of determining whether the SoH of the first battery, the SoH of the second battery, or the SoH of the entire battery is less than a deterioration configuration value, and based on a result of the determination, an operation of notifying of a deteriorated state of the battery.

The method may further include an operation of counting an accumulated usage cycle corresponding to the first battery based on the state information of the first battery, an operation of counting an accumulated usage cycle corresponding to the second battery based on the state information of the second battery, an operation of calculating an accumulated usage cycle of entire battery based on the each accumulated usage cycle an operation of determining whether the accumulated usage cycle of the first battery, the accumulated usage cycle of the second battery, or the accumulated usage cycle of the entire battery exceeds a deterioration usage value, and an operation of notifying of a deteriorated state of the battery based a result of the determination.

The embodiments of the disclosure provided in the specification and the accompanying drawings are just predetermined examples for easily describing the technical contents of the disclosure and helping understanding of the disclosure, but the disclosure is not limited thereto. Therefore, it should be construed that the scope of the disclosure includes all modifications or modified forms obtained based on the technical idea of the disclosure, in addition to the embodiments disclosed herein.

What is claimed is:

1. An electronic device, comprising:
a first housing and a second housing;
a mechanical coupler by which the first housing and the second housing are movably coupled;
a first display and a first battery disposed in the first housing;
a second display and a second battery disposed in the second housing,
a first fuel gauge disposed in the first housing and sensing a state of the first battery;
a second fuel gauge disposed in the second housing and sensing a state of the second battery;
memory storing instructions; and
a processor, wherein the instructions, when executed by the processor, cause the electronic device to:
obtain the state of the first battery via the first fuel gauge,
obtain the state of the second battery via the second fuel gauge,
determine capacity ratios of the first and second batteries based at least on battery capacities of the first and second batteries, as identified via the first and second fuel gauges, respectively,
calculate a residual capacity of the first battery and a residual capacity of the second battery based on at least one of the determined capacity ratios and the obtained states of the first and second battery, respectively, and
output the calculated residual capacity of the first battery and the calculated residual capacity of the second battery via at least one of the first display or the second display.

2. The electronic device of claim 1, wherein the first fuel gauge is internal to the first battery, and the second fuel gauge is internal to the second battery.

3. The electronic device of claim 1, wherein the first fuel gauge is external to the first battery, and the second fuel gauge is external to the second battery.

4. The electronic device of claim 1, further comprising:
a first thermistor for the first battery disposed in the first housing, configured to measure a temperature of the first battery; and
a second thermistor for the second battery disposed in the second housing, configured to measure a temperature of the second battery.

5. The electronic device of claim 4, wherein the first thermistor is internal to the first battery, and the second thermistor is internal to the second battery.

6. The electronic device of claim 4, wherein the first thermistor is external to the first battery, and the second thermistor is external to the second battery.

7. The electronic device of claim 1, further comprising:
a first thermistor for the first battery disposed in the first housing; and
a second thermistor for the second battery disposed in the second housing,
wherein the residual capacity of the first battery is calculated based on at least one of a temperature of the first battery as measured by the first thermistor or the obtained state of the first battery, and
wherein the residual capacity of the second battery is calculated based on at least one of a temperature of the second battery as measured by the second thermistor, or the obtained state of the second battery.

8. The electronic device of claim 1, wherein the instructions, when executed by the processor, cause the electronic device to:
calculate an aggregate residual capacity of an aggregate of the first and second batteries based on both of the residual capacity of the first battery and the residual capacity of the second battery, and
output the calculated aggregate residual capacity of the aggregate of the first and second batteries.

9. The electronic device of claim 1, wherein the instructions, when executed by the processor, cause the electronic device to:
calculate an aggregate residual capacity of an aggregate of the first and second batteries based on at least one a state-of-charging (SoC) of the first battery indicated in the obtained state of the first battery, and an SoC of the second battery indicated in the obtained state of the second battery, and
output the calculated aggregate residual capacity of the aggregate of the first and second batteries.

10. The electronic device of claim 1, wherein the instructions, when executed by the processor, cause the electronic device to:
obtain a state-of-health (SoH) of the first battery via the first fuel gauge,
obtain an SoH of the second battery via the second fuel gauge, and
calculate an aggregate SoH of an aggregate of the first and second batteries based on the obtained SoH of the first battery and the obtained SoH of the second battery.

11. The electronic device of claim 10, wherein the instructions, when executed by the processor, cause the electronic device to:
determine whether any of the calculated SoH of the first battery, the calculated SoH of the second battery, or the calculated aggregate SoH is less than a predetermined deterioration threshold, and
based on a result of the determination, selectively output a notification indicating a deteriorated battery state.

12. The electronic device of claim 1, wherein the instructions, when executed by the processor, cause the electronic device to:
detect an accumulated usage cycle for the first battery, based on the obtained state of the first battery,
detect an accumulated usage cycle for the second battery based on the obtained state of the second battery, and
calculate an accumulated usage cycle of an aggregate of the first and second batteries based on the accumulated usage cycle of the first battery and the accumulated usage cycle of the second battery.

13. The electronic device of claim 12, wherein the instructions, when executed by the processor, cause the electronic device to:
determine whether any of the accumulated usage cycle of the first battery, the accumulated usage cycle of the second battery, or the accumulated usage cycle of the aggregate of the first and second batteries exceeds a usage cycle deterioration value, and
based a result of the determination, selectively output a notification indicating a deteriorated battery state.

14. The electronic device of claim 1, wherein the first housing and the second housing that are foldable along a folding axis defined by the mechanical coupler.

15. The electronic device of claim 1, wherein the first housing that is removably stowable within the second housing via the mechanical coupler.

16. An operation method of an electronic device including a first battery and a second battery, the method comprising:
obtaining state information of the first battery via a first fuel gauge disposed to correspond to the first battery;
obtaining state information of the second battery from a second fuel gauge disposed to correspond to the second battery;
determining capacity ratios of the first and second batteries based at least on battery capacities of the first and second batteries, as identified via the first and second fuel gauges, respectively; and
calculate a residual capacity of the first battery and a residual capacity of the second battery based on at least one of the determined capacity ratios and the obtained states of the first and second battery, respectively, and
wherein the electronic device includes a first housing, a second housing, and a mechanical coupler by which the first housing and the second housing are movably coupled, a first display, the first battery and the first fuel gauge are disposed in the first housing, and a second display, the second battery and the second fuel gauge are disposed in the second housing; and
outputting the calculated residual capacity of the first battery and the calculated residual capacity of the second battery via at least one of the first display or the second display.

17. The method of claim 16, wherein
calculating the residual capacity of the first battery is based on at least one of a temperature of the first battery as measured by a first thermistor, or the obtained state information of the first battery and
wherein calculating the residual capacity of the second battery is based on at least one of a temperature of the second battery as measured by a second thermistor, or the obtained state information of the second battery.

18. The method of claim 16, further comprising:
calculating an aggregate residual capacity of an aggregate of the first and second batteries based on both of the residual capacity of the first battery and the residual capacity of the second battery, and
outputting the calculated aggregate residual capacity of the aggregate of the first and second batteries.

19. The method of claim 16, further comprising:
calculating an aggregate residual capacity of an aggregate of the first and second batteries based on at least one a state-of-charging (SoC) of the first battery indicated in the obtained state of the first battery, and an SoC of the second battery indicated in the obtained state of the second battery, and
outputting the calculated aggregate residual capacity of the aggregate of the first and second batteries.

20. The method of claim 16, further comprising:
obtaining a state-of-health (SoH) of the first battery via the first fuel gauge, obtaining an SoH of the second battery via the second fuel gauge, and calculating an aggregate SoH of an aggregate of the first and second batteries based on the obtained SoH of the first battery and the obtained SoH of the second battery.

* * * * *